(12) United States Patent
Sheppard et al.

(10) Patent No.: US 9,666,707 B2
(45) Date of Patent: May 30, 2017

(54) NITRIDE-BASED TRANSISTORS WITH A CAP LAYER AND A RECESSED GATE

(75) Inventors: Scott Sheppard, Chapel Hill, NC (US); Richard Peter Smith, Carrboro, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/685,910

(22) Filed: Jan. 12, 2010

(65) Prior Publication Data

US 2010/0140664 A1    Jun. 10, 2010

Related U.S. Application Data

(63) Continuation of application No. 11/810,026, filed on Jun. 4, 2007, now Pat. No. 7,678,628, which is a continuation of application No. 10/897,726, filed on Jul. 23, 2004, now Pat. No. 7,238,560.

(51) Int. Cl.
 *H01L 29/778* (2006.01)
 *H01L 29/66* (2006.01)
 *H01L 29/20* (2006.01)

(52) U.S. Cl.
 CPC .... *H01L 29/7787* (2013.01); *H01L 29/66431* (2013.01); *H01L 29/66462* (2013.01); *H01L 29/778* (2013.01); *H01L 29/2003* (2013.01); *H01L 2924/13064* (2013.01)

(58) Field of Classification Search
 CPC ........ H01L 29/66431; H01L 29/778–29/7789; H01L 29/122–29/127; H01L 29/66462; H01L 2924/13064
 USPC .................. 257/183, 194, E29.246, E29.247
 See application file for complete search history.

(56) References Cited

U.S. PATENT DOCUMENTS

| | | | |
|---|---|---|---|
| 4,396,437 | A | 8/1983 | Kwok et al. |
| 4,424,525 | A | 1/1984 | Mimura |
| 4,471,366 | A | 9/1984 | Delagebeaudeuf et al. |
| 4,727,403 | A | 2/1988 | Hilda et al. |
| 4,788,156 | A | 11/1988 | Stoneham et al. |

(Continued)

FOREIGN PATENT DOCUMENTS

| | | |
|---|---|---|
| EP | 0 563 847 A2 | 10/1993 |
| JP | 05-063006 | 3/1993 |

(Continued)

OTHER PUBLICATIONS

Adesida, Hesanmi et al., "High Performance Recessed Gate AlGaN/GaN/HEMTs on Sapphire," *IEICE Transactions on Electronics*, vol. E86-C, No. 10, Oct. 2003, p. 1955-1959.

(Continued)

*Primary Examiner* — Thanhha Pham
(74) *Attorney, Agent, or Firm* — Myers Bigel, P.A.

(57) ABSTRACT

An anneal of a gate recess prior to formation of a gate contact, such as a Schottky contact, may reduce gate leakage and/or provide a high quality gate contact in a semiconductor device, such as a transistor. The use of an encapsulation layer during the anneal may further reduce damage to the semiconductor in the gate recess of the transistor. The anneal may be provided, for example, by an anneal of ohmic contacts of the device. Thus, high quality gate and ohmic contacts may be provided with reduced degradation of the gate region that may result from providing a recessed gate structure as a result of etch damage in forming the recess.

14 Claims, 5 Drawing Sheets

(56) References Cited

U.S. PATENT DOCUMENTS

| | | | |
|---|---|---|---|
| 4,873,558 A * | 10/1989 | Antreasyan | H01L 21/28264 257/289 |
| 4,946,547 A | 8/1990 | Palmour et al. | |
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,292,501 A | 3/1994 | Degenhardt et al. | |
| 5,296,395 A | 3/1994 | Khan et al. | |
| 5,298,445 A | 3/1994 | Asano | |
| RE34,861 E | 2/1995 | Davis et al. | |
| 5,393,993 A | 2/1995 | Edmond et al. | |
| 5,523,589 A | 6/1996 | Edmond et al. | |
| 5,534,462 A | 7/1996 | Fiordalice et al. | |
| 5,592,501 A | 1/1997 | Edmond et al. | |
| 5,700,714 A | 12/1997 | Ogihara et al. | |
| 5,701,019 A | 12/1997 | Matsumoto et al. | |
| 5,705,827 A | 1/1998 | Baba et al. | |
| 5,804,482 A | 9/1998 | Konstantinov et al. | |
| 5,814,533 A | 9/1998 | Shakuda | |
| 5,885,860 A | 3/1999 | Weitzel et al. | |
| 5,946,547 A | 8/1999 | Kim et al. | |
| 6,028,328 A | 2/2000 | Riechert et al. | |
| 6,046,464 A | 4/2000 | Schetzina | |
| 6,064,082 A | 5/2000 | Kawai et al. | |
| 6,177,685 B1 | 1/2001 | Teraguchi et al. | |
| 6,218,680 B1 | 4/2001 | Carter, Jr. et al. | |
| 6,316,793 B1 | 11/2001 | Sheppard | |
| 6,429,467 B1 | 8/2002 | Ando | |
| 6,448,648 B1 | 9/2002 | Boos | |
| 6,492,669 B2 | 12/2002 | Nakayama et al. | |
| 6,515,316 B1 | 2/2003 | Wojtowicz et al. | |
| 6,548,333 B2 | 4/2003 | Smith | |
| 6,586,781 B2 | 7/2003 | Wu et al. | |
| 6,627,473 B1 * | 9/2003 | Oikawa et al. | 438/46 |
| 6,639,255 B2 | 10/2003 | Inoue et al. | |
| 7,238,560 B2 | 7/2007 | Sheppard et al. | 438/172 |
| 2001/0015446 A1 | 8/2001 | Inoue et al. | |
| 2001/0020700 A1 | 9/2001 | Inoue et al. | |
| 2001/0023964 A1 | 9/2001 | Wu et al. | |
| 2002/0066908 A1 | 6/2002 | Smith | |
| 2002/0119610 A1 | 8/2002 | Nishii et al. | |
| 2002/0163012 A1 * | 11/2002 | Nihei et al. | 257/194 |
| 2002/0167023 A1 | 11/2002 | Chavarkar et al. | |
| 2003/0017683 A1 | 1/2003 | Emrick et al. | |
| 2003/0020092 A1 | 1/2003 | Parikh et al. | |
| 2003/0102482 A1 | 6/2003 | Saxler | |
| 2003/0157776 A1 | 8/2003 | Smith | |
| 2003/0213975 A1 | 11/2003 | Hirose et al. | |
| 2003/0218183 A1 * | 11/2003 | Micovic et al. | 257/192 |
| 2004/0004223 A1 | 1/2004 | Nagahama et al. | |
| 2004/0021152 A1 | 2/2004 | Nguyen et al. | |
| 2004/0029330 A1 | 2/2004 | Hussain et al. | |
| 2004/0061129 A1 | 4/2004 | Saxler et al. | |
| 2004/0192043 A1 | 9/2004 | Makita et al. | |
| 2004/0224529 A1 * | 11/2004 | Totsuka et al. | 438/767 |
| 2005/0170574 A1 * | 8/2005 | Sheppard et al. | 438/172 |

FOREIGN PATENT DOCUMENTS

| | | |
|---|---|---|
| JP | 10-050982 | 2/1998 |
| JP | 101998895 A | 7/1998 |
| JP | 2001230407 A | 8/2001 |
| JP | 2002016087 A | 1/2002 |
| JP | 2004-186679 | 7/2004 |
| JP | 2006507683 A | 3/2006 |
| WO | WO 93/23877 A1 | 11/1993 |
| WO | WO 01/57929 A1 | 8/2001 |
| WO | WO 03/049193 A1 | 6/2003 |
| WO | WO 2004/049454 A1 | 6/2004 |

OTHER PUBLICATIONS

Ambacher et al., "Two Dimensional Electron Gases Induced by Spontaneous and Piezoelectric Polarization Charges in N- and Ga-face AlGaN/GaN Heterostructures," *Journal of Applied Physics.* vol. 85, No. 6, pp. 3222-3233 (Mar. 1999).

Asbeck et al. "Piezoelectric charge densities in AlGaN/GaN HFETs," *Elecronics Letters.* vol. 33, No. 14, pp. 1230-1231 (1997).

Ben-Yaacov et al., "AlGaN/GaN Current Aperture Vertical Electron Transistors with Regrown Channels," *Journal of Applied Physics.* vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials.* vol. 28, No. 12, pp. 1420-1423 (1999).

Burm et al. "Recessed Gate GaN MODFETs," *Solid-State Electronics.* vol. 41, No. 2, pp. 247-250 (1997).

Burm et al. "Ultra-Low Resistive Ohmic Contacts on *n*-GaN Using Si Implantation," *Applied Physics Letters.* vol. 70, No. 4, 464-66 (1997).

Chen et al. "Cl2 reactive ion etching for gate recessing of AlGaN/GaN field-effect transistors," *J. Vac. Sci. Technol. B.* vol. 17, No. 6, pp. 2755-2758 (1999).

Coffie, R. et al., "Unpassivated p-GaN/AlGaN/GaN HEMTs with 7.1 W/mm at 10 GHz," *Electronics Letters,* vol. 39, No. 19, Sep. 18, 2003, p. 1419-1420.

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices.* vol. 48, No. 3, pp. 479-485 (Mar. 2001).

Egawa et al. "Recessed gate ALGaN/GaN MODFET on Sapphire Grown by MOCVD," *Applied Physics Letters.* vol. 76, No. 1, pp. 121-123 (Jan. 2000).

Gaska et al. "High-Temperature Performance of AlGaN/GaN HFET's on SiC Substrates," *IEEE Electron Device Letters.* vol. 18, No. 1, pp. 492-494 (Oct. 1997).

Gaska et al. "Electron Transport in AlGaN/GaN Heterostructures Grown on 6H-SiC Substrates," *Applied Physics Letters.* vol. 72, No. 6, pp. 707-709 (Feb. 1998).

Gelmont et al. "Monte Carlo simulation of electron transport in gallium nitride," *Journal of Applied Physics.* vol. 74, No. 3, pp. 1818-1821 (Aug. 1993).

Heikman, et al., "Mass Transport Regrowth of GaN for Ohmic Contacts to AlGaN/GaN," *Applied Physics Letters.* vol. 78, No. 19, pp. 2876.

Heikman et al. "Polarization Effects in AlGaN/GaN and GaN/AlGaN/GaN heterostructures," *Journal of Applied Physics.* vol. 93, No. 12, pp. 10114-10118 (Jun. 2003).

Heikman et al., "Growth of Fe-Doped Semi-insulating GaN by Metalorganic Chemical Vapor Deposition," *Applied Physics Letters.* vol. 83, No. 1, pp. 439-441 (Jul. 2002).

Heikman, Sten J., *MOCVD Growth Technologies for Applications in AlGaN/GaN High Electron Mobility Transistors,* Dissertation, University of California—Santa Barbara, Sep. 2002, 190 pages.

International Search Report corresponding to PCT/US2005/010874, mailed Aug. 5, 2005.

Karmalkar et al. "Enhancement of Breakdown Voltage in AlGaN/GaN High Electron Mobility Transistors Using a Field Plate," *IEEE Transactions on Electron Devices.* vol. 48, No. 8, pp. 1515-1521 (Aug. 2001).

Karmalkar et al. "Resurf AlGaN/GaN HEMT for High Voltage Power Switching," *IEEE Electron Device Letters.* vol. 22, No. 8, pp. 373-375 (Aug. 2001).

Kuliev, A. et al., "Effect of Recess Length on DC and RF Performance of Gate-Recessed AlGaN/GaN HEMTs," *IEEE,* Aug. 6, 2002, p. 428-435.

Kumar, V. et al., "Recessed 0.25µm Gate AlGaN/GaN HEMTs on SiC with High Gate-Drain Breakdown Voltage Using ICP-RIE," *Electronics Letters,* Vo. 37, No. 24, Nov. 22, 2001, p. 1483-1484.

(56) References Cited

OTHER PUBLICATIONS

Kuzmik et al. "Annealing of Schottky contacts deposited on dry etched AlGaN/Gan," *Semiconductor Science and Technology.* vol. 17, No. 11 (Nov. 2002).

Neuburger et al. "Design of GaN-based Field Effect Transistor Structures based on Doping Screening of Polarization Fields," WA 1.5, 7th Wide-Gandgap III-Nitride Workshop (Mar. 2002).

Ping et al. "DC and Microwave Performance of High-Current AlGaN/GaN Heterostructure Field Effect Transistors Grown on p-Type SiC Substrates," *IEEE Electron Device Letters.* vol. 19, No. 2, pp. 54-56 (Feb. 1998).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum.* vols. 338-342, pp. 1643-1646, (2000).

Shen et al., "High-Power Polarization-Engineered GaN/AlGaN/GaN HEMTs Without Surface Passivation," *IEEE Electronics Device Letters.* vol. 25, No. 1, pp. 7-9 (2004).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Samoff Symposium,* Pittsburgh, PA, Mar. 18, 1998.

Sullivan et al. "High-Power 10-GHz Operation of AlGaN HFET's on Insulating SiC," *IEEE Electron Device Letters.* vol. 19, No. 6, pp. 198-200 (Jun. 1998).

Wu et al, "30-W/mm GaN HEMTs by Field Plate Optimization," *IEEE Electron Device Letters.* vol. 25, No. 3, pp. 117-119 (Mar. 2004).

Wu et al. "High Al-Content AlGaN/GaN MODFET's for Ultrahigh Performance," *IEEE Electron Device Letters.* vol. 19, No. 2, pp. 50-53 (Feb. 1998).

Yu et al. "Schottky barrier engineering in III-V nitrides via the piezoelectric effect," *Applied Physics Letters.* vol. 73, No. 13, pp. 1880-1882, (Sep. 1998).

Zolper, J.C. et al., puttered AlN Encapsulant for High-Temperature Annealing of GaN, *Applied Physics Letters,* vol. 69, No. 4, Jul. 22, 1996, p. 538-540.

United States Patent Application entitled "Co-Doping for Fermi Level Control in Semi-Insulating Group III Nitrides," filed Jan. 7, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Semiconductor Devices Having a Hybrid Channel Layer, Current Aperture Transistors and Methods of Fabricating the Same," U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "Methods of Having Laterally Grown Active Region and Methods of Fabricating Same," filed Jul. 26, 2004.

United States Patent Application entitled, "Silicon Carbide on Diamond Substrates and Related Devices and Methods,".

First Office Action, Chinese Patent Application No. 200580024615.7, 9 pages.

Second Office Action, Chinese Patent Application No. 200580024615.7, Feb. 13, 2009, 8 pages.

Communication pursuant to Article 94(3) corresponding to European Application No. 05 735 706.3 dated Feb. 25, 2011; 6 pages.

Notice of Preliminary Rejection (Non-Final) from the Korean Intellectual Property Office corresponding to Korean Patent Application No. 10-2007-7001309; 10 pages.

Official Action, Japanese Patent Application No. 2007-522484, Mailing Date: Sep. 16, 2011.

Official Action of the IPO, Taiwan Patent Application No. 094112478, Mailing Date: Oct. 14, 2011.

Translation of the Official Action, Japanese Patent Application No. 2007-522484, Mailing Date: May 29, 2012.

\* cited by examiner

NITRIDE-BASED TRANSISTORS WITH A CAP LAYER AND A RECESSED GATE

CLAIM OF PRIORITY

This application is a continuation of and claims priority to U.S. patent application Ser. No. 11/810,026, filed on Jun. 4, 2007, now U.S. Pat. No. 7,678,628, which is a continuation of U.S. patent application Ser. No. 10/897,726, filed on Jul. 23, 2004, now U.S. Pat. No. 7,238,560, the disclosures of which are incorporated herein by reference in their entirety.

FIELD OF THE INVENTION

The present invention relates to semiconductor devices and, more particularly, to transistors that incorporate nitride-based active layers.

BACKGROUND

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

One step in the fabrication of some nitride-based transistors is the formation of a gate contact in a recess. A thick cap structure of the transistor may be desirable in achieving high current capability and low dispersion. However, a gate recess through the cap layer may be desirable to achieve high breakdown voltage, low RF dispersion and/or high transconductance with concomitant high-frequency performance. On the other hand, an etching process used to form a recessed gate structure may damage the underlying barrier layer(s) from which electrons originate. U.S. patent application Ser. No. 10/758,871, filed Jan. 16, 2004 and entitled "NITRIDE-BASED TRANSISTORS WITH A CAP LAYER AND A LOW-DAMAGE RECESS AND METHODS OF FABRICATION THEREOF", the disclosure of which is incorporated herein as if set forth fully herein, describes devices and techniques to provide a low-damage recess through SiN passivation.

Other attempts to mitigate high leakage on etched GaN and AlGaN surfaces have included using a high temperature anneal after a Schottky metal is deposited. Such attempts have used anneal temperatures of 400-600° C. Post-Schottky high-temperature annealing appears to improve a high leakage Schottky/AlGaN contact to a moderately leaky Schottky/AlGaN contact.

SUMMARY OF THE INVENTION

Some embodiments of the present invention provide methods of fabricating high electron mobility transistors (HEMTs), including forming a channel layer, forming a barrier layer on the channel layer, forming a cap layer on the barrier layer and forming a gate recess in the cap layer that extends to the barrier layer. The barrier layer, channel layer and cap layer with the gate recess are annealed and then a gate contact is formed in the annealed gate recess. The gate contact may be a Schottky contact.

In further embodiments of the present invention, annealing the barrier layer, channel layer and cap layer with the gate recess includes annealing the barrier layer, channel layer and cap layer with the gate recess at a temperature of at least about 700° C. The annealing may be preceded by forming an encapsulation layer on the cap layer and in the gate recess. The annealing may be followed by removing the encapsulation layer and forming a Schottky gate contact may be preceded by removing the encapsulation layer. The encapsulation layer may include AlN.

In additional embodiments of the present invention, the methods further include forming ohmic contact recesses in the cap layer on opposite sides of the gate recess and forming ohmic contact material patterns in the ohmic contact recesses. In some embodiments, annealing the barrier layer, channel layer and cap layer with the gate recess includes annealing the barrier layer, channel layer, ohmic contact material patterns and cap layer with the gate recess. Furthermore, forming ohmic contact material patterns may be followed by, and annealing may be preceded by, forming an encapsulation layer on the cap layer, the ohmic contact material patterns and in the gate recess. The annealing may be followed by, and forming a gate contact may be preceded by removing the encapsulation layer. The encapsulation layer may include AlN.

In still further embodiments of the present invention, forming a gate recess includes patterning a mask layer on the cap layer to have an opening corresponding to the gate recess and etching the cap layer using the patterned mask layer as an etch mask to provide the gate recess. The annealing may be preceded by faulting an encapsulation layer on the patterned mask layer and the gate recess. The encapsulation layer may include AlN. The annealing may be followed by removing the mask layer and the encapsulation layer utilizing a self-aligned lift-off technique so as to provide a portion of the encapsulation layer that remains in the gate recess. The portion of the encapsulation layer in the gate recess may be removed prior to forming the gate contact.

In some embodiments of the present invention, an insulating layer is formed on the cap layer and in the gate recess. The gate contact may be formed on the insulating layer in the gate recess. The gate contact may also extend onto the insulating layer on the cap layer.

In some embodiments of the present invention, forming a cap layer includes forming a GaN layer on the barrier layer. For example, the GaN layer may be an undoped GaN layer, an AlGaN layer graded to GaN, an AlGaN layer graded to GaN and a doped GaN layer and/or a doped GaN layer. Forming a cap layer may also include forming a GaN layer on the barrier layer and forming a SiN layer on the GaN layer. Furthermore, forming a gate recess may include forming a gate recess that extends through the cap layer and into but not through the barrier layer. In particular embodiments of the present invention, the cap layer includes a GaN based semiconductor material.

In additional embodiments of the present invention, methods of fabricating high electron mobility transistors include forming a first layer of GaN based semiconductor material on a substrate, forming a second layer of AlGaN based semiconductor material on the first layer, the second layer being configured to induce a two-dimensional electron gas in a region proximate an interface between the first layer and the second layer and forming a third layer of GaN based semiconductor material on the second layer of GaN based semiconductor material. The methods further include forming a gate recess in the third layer that extends to the second layer, annealing the first layer, second layer and third layer with the gate recess and then forming a gate contact in the annealed gate recess. The gate contact may be a Schottky gate contact.

In further embodiments of the present invention, the annealing is preceded by forming an encapsulation layer on the third layer of GaN based semiconductor material and in the gate recess. The anneal may be followed by removing the encapsulation layer. Forming a gate contact may be preceded by removing the encapsulation layer.

In still further embodiments of the present invention, the methods further include forming ohmic contact recesses in the third layer of GaN based semiconductor material on opposite sides of the gate recess and forming ohmic contact material patterns in the ohmic contact recesses. In such a case, annealing the first layer, second layer and third layer with the gate recess includes annealing the first layer, second layer, ohmic contact material patterns and third layer with the gate recess.

In additional embodiments of the present invention, forming a gate recess includes patterning a mask layer on the third layer of GaN based semiconductor material to have an opening corresponding to the gate recess and etching the third layer of GaN based semiconductor material using the patterned mask layer as an etch mask to provide the gate recess. In such a case, the annealing is preceded by forming an encapsulation layer on the patterned mask layer and the gate recess and is followed by removing the mask layer and the encapsulation layer utilizing a self-aligned lift-off technique so as to provide a portion of the encapsulation layer that remains in the gate recess. The encapsulation layer may include AlN, $SiO_2$, and oxynitride, an ONO structure and/or SiN.

In some embodiments of the present invention, the portion of the encapsulation layer that remains in the gate recess is removed prior to forming the gate contact. Furthermore, an insulating layer may be formed on the third layer of GaN-based material and in the recess and the gate contact formed on the insulating layer in the gate recess. The gate contact may also be formed on the insulating layer on the third layer of GaN-based material.

DETAILED DESCRIPTION OF EMBODIMENTS OF THE INVENTION

Figure 1A:
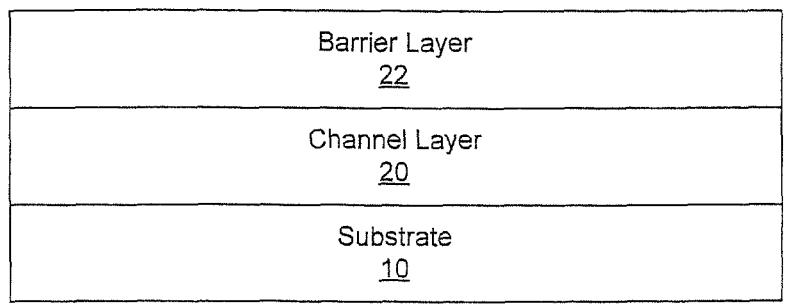
FIGS. 1A-1F are schematic drawings illustrating fabrication of transistors according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Some embodiments of the present invention utilize an anneal of a recess prior to formation of a Schottky contact to reduce gate leakage and/or provide a high quality Schottky contact in a semiconductor device, such as a transistor. In some embodiments of the present invention an anneal of a recess may also restore conductivity to the 2DEG channel under the etched recess area. The use of an encapsulation layer during the anneal may prevent further damage to the semiconductor in the gate recess of the transistor. The anneal may be provided, for example, by an anneal of ohmic contacts of the device. Thus, high quality gate and ohmic contacts may be provided with reduced degradation of the gate region that may result from providing a recessed gate structure as a result of etch damage in forming the recess.

Embodiments of the present invention may be particularly well suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Suitable structures for GaN-based HEMTs that may utilize embodiments of the present invention are described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Provisional Patent Application Ser. No. 60/290,195 filed May 11, 2001 for "GROUP III NITRIDE BASED HIGH ELECTRON MOBILITY TRANSISTOR (HEMT) WITH BARRIER/SPACER LAYER," U.S. Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," and U.S. Patent Publication No. 2003/0020092 filed Jul. 23, 2002 and published Jan. 30, 2003 for "INSULATING GATE ALGAN/GAN HEMT", the disclosures of which are hereby incorporated herein by reference in their entirety.

Methods of fabrication according to some embodiments of the present invention are schematically illustrated in FIGS. 1A-1F. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. Patent Publication No. 2003/0102482A1, filed Jul. 19, 2002 and published Jun. 5, 2003, and entitled "STRAIN BALANCED NITRIDE HETROJUNCTION TRANSISTORS AND METHODS OF FABRICATING STRAIN BALANCED NITRIDE HETEROJUNCTION TRANSISTORS, and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated herein by reference as if set forth fully herein.

Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1A, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited by MOCVD or by other techniques known to those of skill in the art, such as MBE or HVPE.

In some embodiments of the present invention, the channel layer 20 is a Group III-nitride, such as $Al_xGa_{1-x}N$ where $0 \le x < 1$, provided that the energy of the conduction band edge of the channel layer 20 is less than the energy of the conduction band edge of the barrier layer 22 at the interface between the channel and barrier layers. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A barrier layer 22 is provided on the channel layer 20. The channel layer 20 may have a bandgap that is less than the bandgap of the barrier layer 22 and the channel layer 20 may also have a larger electron affinity than the barrier layer 22. The barrier layer 22 may be deposited on the channel layer 20. In certain embodiments of the present invention, the barrier layer 22 is AlN, AlInN, AlGaN or AlInGaN with a thickness of between about 0.1 nm and about 40 nm. Examples of layers according to certain embodiments of the present invention are described in U.S. Patent Publication No. 2002/0167023A1, to Smorchkova et al., entitled "GROUP-III NITRIDE BASED HIGH ELECTRON MOBILITY TRANSISTOR (HEMT) WITH BARRIER/ SPACER LAYER" the disclosure of which is incorporated herein by reference as if set forth fully herein. In particular embodiments of the present invention, the barrier layer 22 is thick enough and has a high enough Al composition and doping to induce a significant carrier concentration at the interface between the channel layer 20 and the barrier layer 22 through polarization effects. Also, the barrier layer 22 should be thick enough to reduce or minimize scattering of electrons in the channel due to ionized impurities or imperfections deposited at the interface between the barrier layer 22 and the cap layer 24 (FIG. 1B).

The barrier layer 22 may be a Group III-nitride and has a bandgap larger than that of the channel layer 20 and a smaller electron affinity than the channel layer 20. Accordingly, in certain embodiments of the present invention, the barrier layer 22 is AlGaN, AlInGaN and/or AlN or combinations of layers thereof. The barrier layer 22 may, for example, be from about 0.1 nm to about 40 nm thick, but is not so thick as to cause cracking or substantial defect formation therein. In certain embodiments of the present invention, the barrier layer 22 is undoped or doped with an n-type dopant to a concentration less than about $10^{19}$ cm$^{-3}$. In some embodiments of the present invention, the barrier layer 22 is $Al_xGa_{1-x}N$ where $0 < x < 1$. In particular embodiments, the aluminum concentration is about 25%. However, in other embodiments of the present invention, the barrier layer 22 comprises AlGaN with an aluminum concentration of between about 5% and about 100%. In specific embodiments of the present invention, the aluminum concentration is greater than about 10%.

Figure 1B:
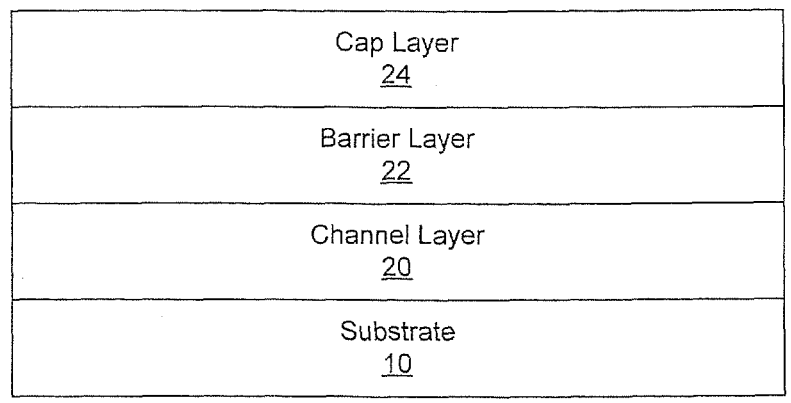

FIG. 1B illustrates formation of a relatively thick cap layer 24 on the barrier layer 22. The cap layer 24 may be a Group III-nitride, and, in some embodiments, a GaN based semiconductor material, such as GaN, AlGaN and/or InGaN. In particular embodiments of the present invention, the cap layer is GaN. Furthermore, the cap layer 24 may be a single layer or multiple layers of uniform and/or non-uniform composition and/or thickness. In some embodiments of the present invention, the cap layer 24 may be a graded AlGaN layer and a GaN layer as described in Shen et al., "High-Power Polarization-Engineered GaN/AlGaN/GaN HEMTs Without Surface Passivation," IEEE Electron Device Letters, Vol. 25, No. 1, pp. 7-9, January 2004, the disclosure of which is incorporated herein by reference as if set forth in its entirety. For example, in some embodiments of the present invention, the cap layer 24 may be a GaN layer with a SiN layer on the GaN layer. The cap layer 24 moves the top surface of the device physically away from the channel, which may reduce the effect of the surface.

The cap layer 24 may be blanket formed on the barrier layer 22 and may be epitaxially grown and/or formed by deposition. For example, the cap layer may be formed by in-situ growth of SiN on a GaN cap layer or ex-situ PECVD of SiN or $SiO_2$ on top of the GaN cap layer. Typically, the cap layer 24 may have a thickness of from about 2 nm to about 500 nm. For example, a cap layer 24 of SiN and GaN may have a thickness of about 300 nm. Examples of cap layers according to some embodiments of the present invention are described in U.S. Patent Publication No. 2002/ 0167023A1, to Smorchkova et al., entitled "GROUP-III NITRIDE BASED HIGH ELECTRON MOBILITY TRANSISTOR (HEMT) WITH BARRIER/SPACER LAYER."

Figure 1C:
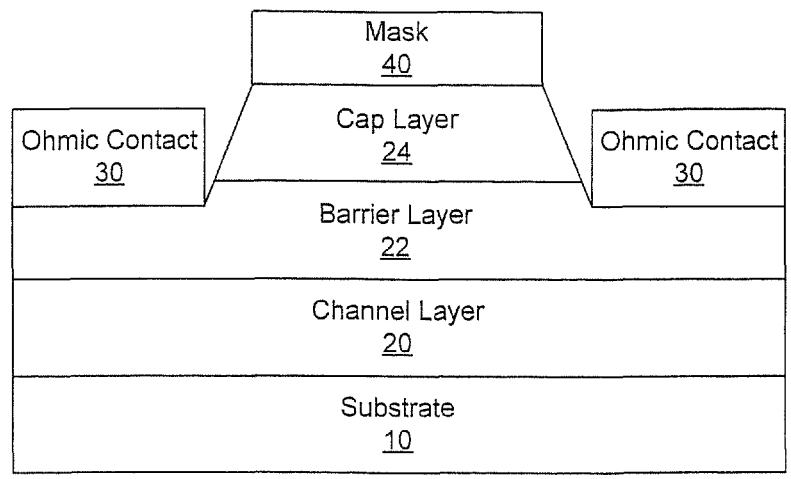

As illustrated in FIG. 1C, windows are opened in a mask layer to provide a first mask pattern 40 for formation of ohmic contacts 30. In some embodiments of the present invention, the first mask layer may be a conventional photolithography mask material. In some embodiments of the present invention, the mask material may be SiN, $SiO_2$ or the like. The windows may be formed utilizing a patterned mask and an etch process to expose the underlying barrier layer 22. In some embodiments of the present invention, the etch may be a low damage etch. In some embodiments of the present invention the etch is a wet etch with a strong base, such as KOH with UV illumination. In other embodiments, the etch is a dry etch. Examples of low damage etch techniques for Group III-nitrides include etching techniques other than reactive ion etching, such as inductively coupled plasma using $Cl_2$, $BCl_3$, $CCl_2F_2$ and/or other chlorinated species or electron cyclotron resonance (ECR) and/or downstream plasma etching with no DC component to the plasma. Examples of low damage etch techniques for SiN include etching techniques other than reactive ion etching, such as inductively coupled plasma using $CF_4/O_2$, $NF_3/O_2$ and/or other fluorinated species or electron cyclotron resonance (ECR) and/or downstream plasma etching with no DC component to the plasma.

As is further illustrated in FIG. 1C, for example, with a subsequent photolithography step and evaporation, ohmic metal is patterned to provide ohmic contact material patterns that when annealed provide the ohmic contacts 30. In some embodiments of the present invention utilizing SiN and/or $SiO_2$ in the cap layer 24, the ohmic contacts 30 are spaced apart from the SiN and/or $SiO_2$ portions of the cap layer 24 a distance sufficiently large to allow for misalignment tolerances in the formation and patterning of the ohmic contact metal. If the ohmic contact metal contacts the SiN and/or $SiO_2$ portions of cap layer 24, the metal may diffuse into the cap layer 24 during subsequent heating steps that may result in a short between a gate contact and the ohmic contact(s) 30.

Figure 1D:
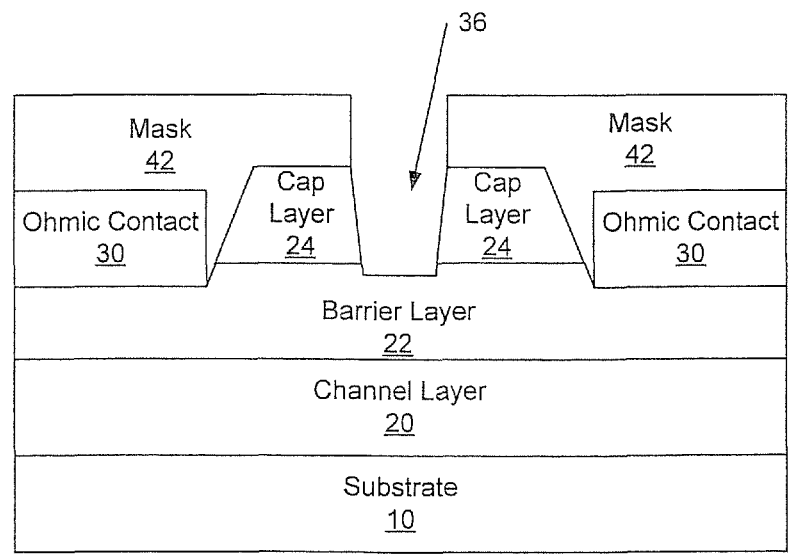

FIG. 1D illustrates the formation of a gate recess. As seen in FIG. 1D, a second mask pattern 42 is formed on the ohmic contacts and the cap layer 24 and patterned to form a window that exposes a portion of the cap layer 24. In some embodiments of the present invention, the second mask pattern 42 may be a conventional photolithography mask material. In some embodiments of the present invention, the mask material may be silicon nitride, silicon dioxide or the like. A recess 36 is then formed through the cap layer 24 to expose a portion of the barrier layer 22. In some embodiments of the present invention, the recess 36 is formed to extend into the barrier layer 22. The recess 36 may extend into the barrier layer 22 to, for example, adjust performance characteristics of the device such as threshold voltage, frequency performance, etc. The recess may be formed using the mask 42 and an etch process as described above. In particular embodiments where the ohmic contacts 30 provide source and drain contacts, the recess may be offset between the source and drain contacts such that the recess, and subsequently the gate contact 32, is closer to the source contact than the drain contact.

Figure 1E:
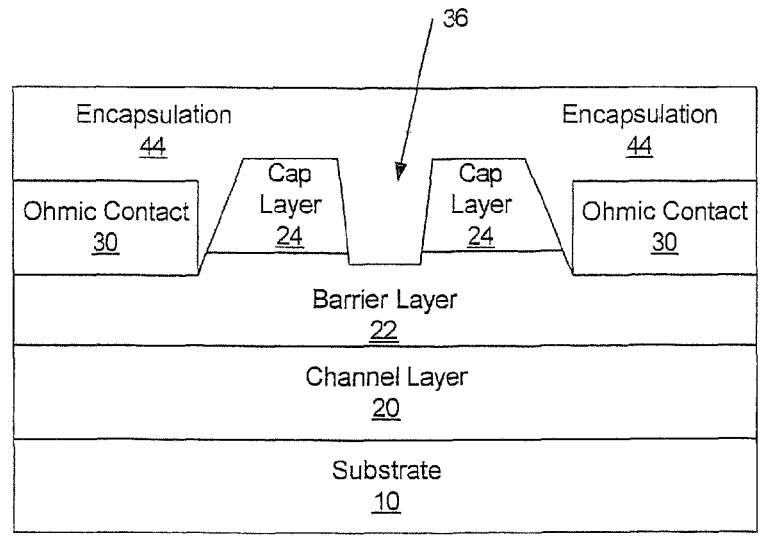

FIG. 1E illustrates the formation of an optional encapsulation layer 44 after removal of the second mask pattern 42. The encapsulation layer 44 may be formed on the cap layer 24 and in the recess 36. The encapsulation layer 44 may be silicon nitride ($Si_xN_y$), aluminum nitride (AlN), an ONO structure and/or other suitable protective material, such as silicon dioxide ($SiO_2$) and/or an oxynitride. Other materials may also be utilized for the encapsulation layer 44 as long as the material may be removed without significantly damaging the underlying barrier layer 22. For example, the encapsulation layer 44 could also include magnesium oxide, scandium oxide, aluminum oxide and/or aluminum oxynitride. Furthermore, the encapsulation layer 44 may be a single layer or multiple layers of uniform and/or non-uniform composition.

In particular embodiments of the present invention, the encapsulation layer 44 may be SiN, AlN, an ONO structure and/or $SiO_2$. The SiN, MN and/or $SiO_2$ may be formed by PVD and/or CVD and may be non-stoichiometric. Suitable encapsulation materials are described in further detail with reference to the protective layer in U.S. patent application Ser. No. 10/758,871, filed Jan. 16, 2004 and entitled "NITRIDE-BASED TRANSISTORS WITH A CAP LAYER AND A LOW-DAMAGE RECESS AND METHODS OF FABRICATION THEREOF", the disclosure of which is incorporated herein as if set forth fully herein.

The encapsulation layer 44 may be blanket formed on the cap layer 24 and into the recess 36 so as to be positioned on the barrier layer 22 in the recess 36 and may be formed by deposition. For example, a silicon nitride layer may be formed by high quality sputtering and/or PECVD. Typically, the encapsulation layer 44 may have a thickness of about 30 nm, however, other thickness layers may also be utilized. For example, the encapsulation layer should be sufficiently thick so as to protect the underlying layers during a subsequent anneal of ohmic contacts. Layers as thin as two or three monolayers may be sufficient for such purposes. However, in general, the encapsulation layer 44 may have a thickness of from about 10 nm to about 500 nm. Also, a high quality SiN protective layer may be grown in-situ with the MOCVD growth of the group III nitride layers.

After formation of the gate recess 36 and the encapsulation layer 44 if present, but prior to formation of a gate contact, the ohmic contact material is annealed to provide the ohmic contacts 30. The anneal may be a high temperature anneal. For example, the anneal may be at a temperature of from about 700° C. to about 900° C. and in some embodiments, greater than about 900° C. For example, an anneal may be carried out for from about 30 seconds to about five minutes in an environmental temperature of from about 700° C. to about 900° C. as measured using conventional measuring techniques in rapid thermal anneal systems, such as using a thermocouple embedded in a susceptor holding the wafer and/or optically by pyrometry. Through the use of an ohmic contact anneal, the resistance of the ohmic contacts may be reduced from a high resistance to less than about 1 Ω-mm. Thus, as used herein, the term "ohmic contact" refers to a non-rectifying contact that has a contact resistance of less than about 1 Ω-mm. The anneal of the etched gate recess 36 may remove damage to the barrier layer 22 that may result from fabrication of the gate recess 36. Thus, for example, the sheet resistance of the region of the barrier layer 22 proximate the gate recess 36 after the high temperature ohmic contact anneal may be substantially the same as the sheet resistance of the region as if the remaining un-etched barrier layer were grown in the reactor.

Figure 1F:
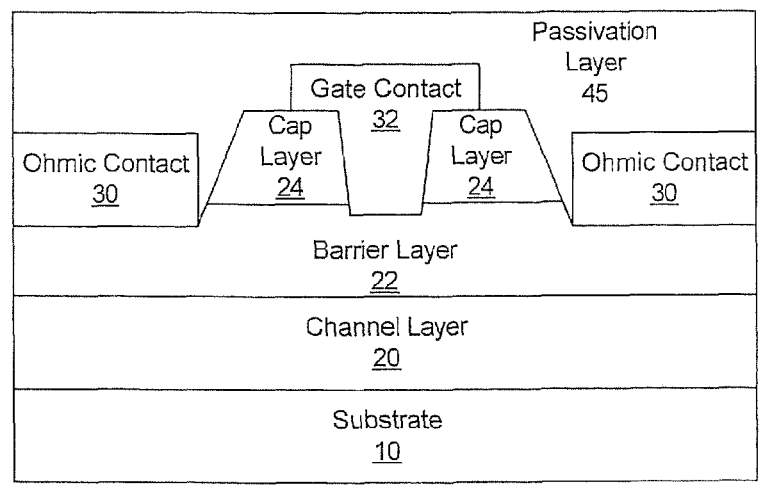

As seen in FIG. 1F, the encapsulation layer 44 is removed if present and a gate contact 32 is formed in the recess and contacts the exposed portion of the barrier layer 22. The gate contact may be a "T" gate as illustrated in FIG. 1F and may be fabricated using conventional fabrication techniques. Suitable gate materials may depend on the composition of the barrier layer, however, in certain embodiments, conventional materials capable of making a Schottky contact to a nitride based semiconductor material may be used, such as Ni, Pt, $NiSi_x$, Cu, Pd, Cr, W and/or WSiN. It is possible that a small gap between the cap layer 24 and the gate contact 32 may arise as a result of, for example, anisotropy of the gate recess etch, resulting in an exposed surface of the barrier layer 22 between the protective layer 24 and the gate contact 32. This gap may be formed intentionally.

An optional passivation layer may also be provided on the structure of FIG. 1F. The passivation layer may be blanket deposited on the structure of FIG. 1F. In particular embodiments, the passivation layer may be deposited so as to substantially fill the gap between the cap layer 24 and the ohmic contacts 30, if present, and also the gap between the cap layer 24 and the gate contact 32, if such gap exists. In certain embodiments of the present invention, the passivation layer may be silicon nitride, aluminum nitride, silicon dioxide, an ONO structure and/or an oxynitride. Furthermore, the passivation layer may be a single or multiple layers of uniform and/or non-uniform composition.

Figure 2A:
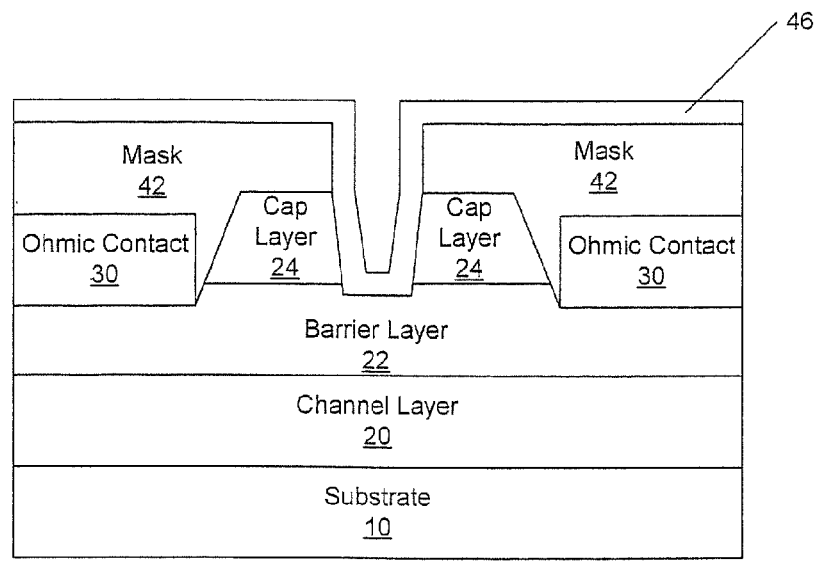
FIGS. 2A and 2B are schematic drawings illustrating fabrication of transistors according to further embodiments of the present invention.
Figure 2B:
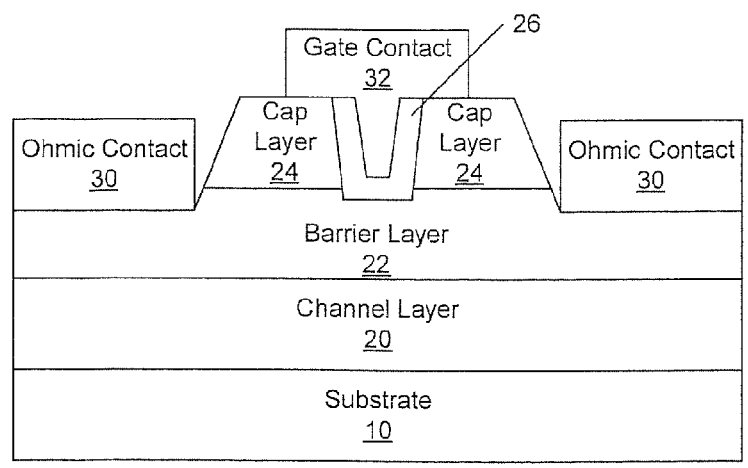

FIGS. 2A and 2B illustrate fabrication of transistors according to further embodiments of the present invention. Fabrication of the transistors of FIGS. 2A and 2B may be provided in the same manner as described above with reference to FIGS. 1A-1D. However, as seen in FIG. 2A, rather than removing the second mask pattern 42, an encapsulation layer 46 is provided on the mask 42 and in the recess 36. The encapsulation layer 46 may, for example, be formed of the same materials as described above with reference to the encapsulation layer 44. In particular embodiments of the present invention, the encapsulation layer 46 is MN. In further embodiments of the present invention, the encapsulation layer 46 may be any inert ceramic material. Furthermore, the second mask 42 may be SiN.

In embodiments of the present invention where the second mask 42 is a photo-resist or other material that may be substantially damaged by a subsequent anneal, the second mask 42 and portions of the encapsulation layer 46 are removed, for example, using a self-aligned lift-off technique, to provide a portion 26 of the encapsulation layer 46 in the gate recess. The structure of FIG. 2A is then annealed as described above. The encapsulation layer 46 may, in some embodiments of the present invention, have a thickness of from about 1 nm to about 500 nm.

As is seen in FIG. 2B, the second mask 42 and portions of the encapsulation layer 46 are removed, for example, using a self-aligned lift-off technique, to provide a portion 26 of the encapsulation layer 46 in the gate recess. The gate contact 32 is then formed on the portion 26 remaining in the gate recess. In some embodiments, the portion 26 is removed prior to formation of the gate contact 32. In the embodiments illustrated in FIG. 2B, the gate contact may be formed of materials as described above.

Figure 3:
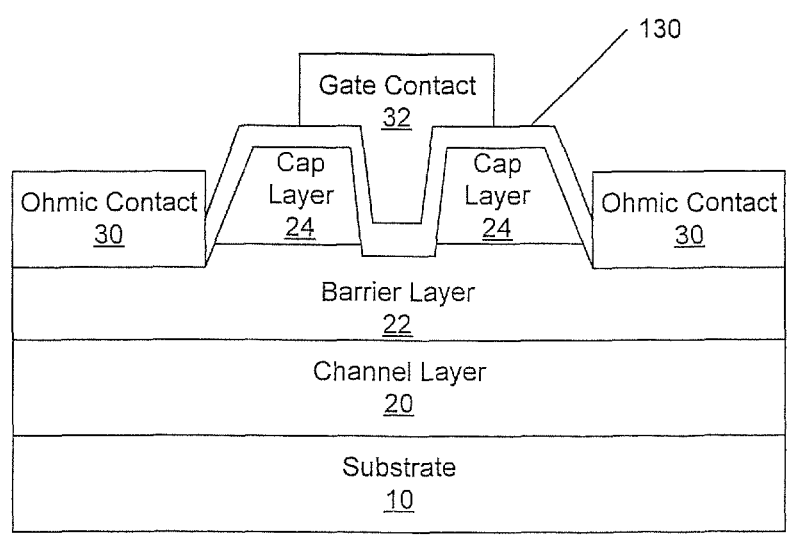
FIG. 3 is a schematic drawing illustrating fabrication of transistors according to further embodiments of the present invention.

FIG. 3 illustrates formation of transistors according to further embodiments of the present invention. As seen in FIG. 3, the structure of FIG. 2B may have the portion 26 removed and an insulating layer 130 formed on the resulting structure including in the gate recess. The gate contact 32 may then be formed on the insulating layer 130. The insulating layer 130 may be one or more layers and may include, for example, SiN, AlN, SiO$_2$, and/or an ONO structure. Thus, in some embodiments of the present invention, an insulating gate HEMT may be provided, for example, as described in U.S. Patent Publication No. 2003/0020092 entitled "INSULATING GATE ALGAN/GAN HEMT", to Parikh et al., the disclosure of which is incorporated herein by reference as if set forth fully herein.

While embodiments of the present invention have been described with reference to a particular sequence of operations, some modification in the sequence may be made or other operations may be included while still benefiting from the teachings of the present invention. For example, the formation of the cap layer 24 prior to ohmic metal deposition may be omitted and the ohmic metal may be deposited and patterned on the barrier layer 22 to provide ohmic contact material regions 30 on the barrier layer 22. A cap layer could then be formed after deposition and patterning of the ohmic contact material. The cap layer may then be etched to provide the gate recess and the ohmic contact anneal carried out prior to formation of the gate contact.

Operations described above as being provided in a single step may be provided in multiple steps and, likewise, operations described as multiple steps could be combined into a single step. For example, while the anneal to remove damage from the gate recess etch has been described as provided by the ohmic contact anneal, a separate anneal could also be provided. If the anneal is provided as a separate anneal, the anneal may be carried out, for example, at a temperature of from about 600° C. to about 900° C. for from about 20 minutes to about thirty seconds. Additionally, the etch of the ohmic contact recess and the gate recess may be carried out using a single mask rather than two separate masks as described above.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein. In some embodiments, insulating layers such as SiN, an ONO structure or relatively high quality MN may be deposited for making a MISHEMT and/or passivating the surface. The additional layers may also include a compositionally graded transition layer or layers.

Furthermore, the barrier layer 22 may also be provided with multiple layers as described in U.S. Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In the drawings and specification, there have been disclosed typical embodiments of the invention, and, although specific terms have been employed, they have been used in a generic and descriptive sense only and not for purposes of limitation.

That which is claimed is:

1. A high electron mobility transistor (HEMT), comprising:
   a barrier layer;
   a cap layer on the barrier layer;
   a gate recess in the cap layer that extends to, but not through, the barrier layer;
   a gate contact in the gate recess, wherein a sheet resistance of the barrier layer proximate the gate recess is substantially the same after an anneal of the barrier layer, the cap layer and the gate recess as an as grown sheet resistance of the barrier layer; and
   an encapsulation layer in the gate recess conformally on sidewalls of the gate recess and not on an upper surface of the cap layer, a top surface of the encapsulation layer being co-planar with a top surface of the cap layer, the encapsulation layer extending between the gate contact and the cap layer such that the gate contact is spaced apart from a surface of the barrier layer opposite an upper surface of the gate contact and the gate contact is directly on an entire surface of the encapsulation layer in the gate recess.

2. The HEMT of claim 1, further comprising ohmic contact material patterns in ohmic contact recesses in the cap layer, wherein the ohmic contact material patterns are annealed with the barrier layer, the cap layer and the gate recess.

3. The HEMT of claim 2, further comprising a channel layer, wherein the barrier layer is on the channel layer and wherein the channel layer is annealed with the barrier layer, the ohmic contact material patterns, the cap layer and the gate recess.

4. The HEMT of claim 1, wherein the gate contact comprises a Schottky contact.

5. The HEMT of claim 1, wherein the cap layer comprises a GaN layer on the barrier layer.

6. The HEMT of claim 1, wherein the cap layer comprises:
   a GaN layer on the barrier layer; and
   a SiN layer on the GaN layer.

7. The HEMT of claim 6, wherein the SiN layer is formed in-situ.

8. The HEMT of claim 1, wherein the gate recess extends through the cap layer and into but not through the barrier layer.

9. The HEMT of claim 1, wherein the cap layer comprises a GaN based semiconductor material.

10. The HEMT of claim 1, wherein the cap layer is directly on the barrier layer.

11. The HEMT of claim 1, wherein the encapsulation layer comprises one of aluminum nitride (AlN) and an inert ceramic material.

12. A high electron mobility transistor (HEMT), comprising:
   a barrier layer;
   a cap layer on the barrier layer;
   a gate recess in the cap layer that extends to, but not through, the barrier layer;
   a gate contact in the gate recess, wherein a sheet resistance of the barrier layer proximate the gate recess is substantially the same after an anneal of the barrier layer, the cap layer and the gate recess as an as grown sheet resistance of the barrier layer; and
   a protective layer in the gate recess, a top surface of the protective layer being co-planar with a top surface of the cap layer, the protective layer extending between the gate contact and the cap layer such that a surface of the barrier layer opposite an upper surface of the gate contact is spaced apart from the gate contact and that the gate contact is directly on an entire surface of the protective layer in the gate recess,
   wherein the protective layer comprises one or more layers including at least one of silicon nitride (SiN), aluminum nitride (AlN), silicon oxide ($SiO_2$), and an oxide-nitride-oxide (ONO) structure.

13. The HEMT of claim 12, wherein the protective layer extends on a surface of the cap layer opposite the barrier layer.

14. The HEMT of claim 13, wherein the protective layer extends on sidewalls of the cap layer adjacent ohmic contacts of the HEMT.

* * * * *

UNITED STATES PATENT AND TRADEMARK OFFICE
CERTIFICATE OF CORRECTION

PATENT NO. : 9,666,707 B2
APPLICATION NO. : 12/685910
DATED : May 30, 2017
INVENTOR(S) : Sheppard et al.

Page 1 of 1

It is certified that error appears in the above-identified patent and that said Letters Patent is hereby corrected as shown below:

In the Specification

Column 11, Line 24: Please correct "layer 46 is MN." to read -- layer 46 is AlN. --

Column 12, Line 42: Please correct "high quality MN may" to read -- high quality AlN may --

Signed and Sealed this
Twenty-sixth Day of December, 2017

Joseph Matal
*Performing the Functions and Duties of the
Under Secretary of Commerce for Intellectual Property and
Director of the United States Patent and Trademark Office*